United States Patent [19]
Bushehri et al.

[11] Patent Number: 5,920,205
[45] Date of Patent: Jul. 6, 1999

[54] LOADING ELEMENT FOR A LOGIC GATE

[76] Inventors: Ebrahim Bushehri; Vladimar Bratov; Victor I. Staroselski, all of Middlesex University, Bounds Green Road, London N11 2NQ, United Kingdom

[21] Appl. No.: 08/866,756

[22] Filed: May 30, 1997

[30] Foreign Application Priority Data

May 31, 1996 [GB] United Kingdom .................. 9611402

[51] Int. Cl.⁶ ...................... H03K 19/094; H03K 19/20; H03F 3/45

[52] U.S. Cl. ......................... 326/115; 326/112; 327/314; 327/52

[58] Field of Search ................................ 326/115, 112, 326/119, 83; 327/314, 325, 52, 65

[56] References Cited

U.S. PATENT DOCUMENTS 5,483,183  1/1996  Li et al. .................................. 327/54

FOREIGN PATENT DOCUMENTS 4-54723     2/1992   European Pat. Off. ....... H03K 17/16
0660524 A1 12/1994   European Pat. Off. ....... H03K 19/21

*Primary Examiner*—Michael Tokar
*Assistant Examiner*—Daniel D. Chang

[57] ABSTRACT

A loading arrangement for an input stage of a source coupled logic gate comprises a loading element having at least one resistive element and at least one voltage limiting element connected in parallel with one another. There is also disclosed a loading arrangement comprising resistive and voltage limiting elements connected in parallel.

13 Claims, 10 Drawing Sheets

LOADING ELEMENT FOR A LOGIC GATE

TECHNICAL FIELD

This invention relates to a loading arrangement for a source coupled logic gate and more particularly to a differential logic gate configuration for integrated circuits, which configuration utilizes transistors, particularly field effect transistors with the presence of Schottky diode at the gate region. Examples of such transistors are Gallium Arsenide MESFETs (Metal Semiconductor Field Effect Transistors) or GaAs/AlGaAs HEMTs (High Electron Mobility Transistors).

BACKGROUND OF THE INVENTION

FIG. 1 of the accompanying drawings is a circuit diagram of a known source coupled logic gate performing a NOR/NAND function, consisting of a transistor current source (10) with its drain connected to the common source nodes of two bottom-level switching transistors (21, 22), the gate nodes of which are the bottom-level inputs (PC, NC) of the logic gate. Their drain nodes are connected either to one of the two top-level outputs of the input stage (PT, NT) or the source nodes of the top-level switching transistors (31, 32). The gate nodes of transistors 31 and 32 are the top-level inputs of the logic gate (PA, NA) and their drain nodes are connected to said top-level outputs of the input stage which in turn are connected to the positive power supply voltage node (VDD) through the simple resistive load elements (41, 42) as well as to the inputs of two buffer/level shifters for driving the following gate top-level and bottom-level inputs.

The present invention aims to reduce the power dissipation and complexity of the known source coupled logic gate configuration and to provide an efficient means for the implementation of logic functions, utilizing Field Effect Transistors with the presence of Schottky diode at the gate region.

The source coupled logic gate configuration utilizing Field Effect Transistors with the presence of Schottky diode at the gate region comprises an input stage for the implementation of a given logic function followed by buffer/level shifters.

SUMMARY OF THE INVENTION

An object of this invention seeks to provide a circuit arrangement for the loading elements of the input stage to reduce power dissipation and complexity of source coupled logic gates.

Accordingly, one aspect of the present invention provides a loading arrangement for the input stage of a source coupled logic gate, which loading arrangement comprises a loading element having at least one resistive element and at least one voltage limiting element connected in parallel with one another.

A further aspect of the present invention provides a loading arrangement comprising resistive and voltage limiting elements connected in parallel.

In order that the object of the present invention may be more readily understood, embodiments thereof will now be described, by way of example, with reference to the accompanying drawings.

DETAILED DESCRIPTION OF PREFERRED EMBODIMENT

Figure 1:
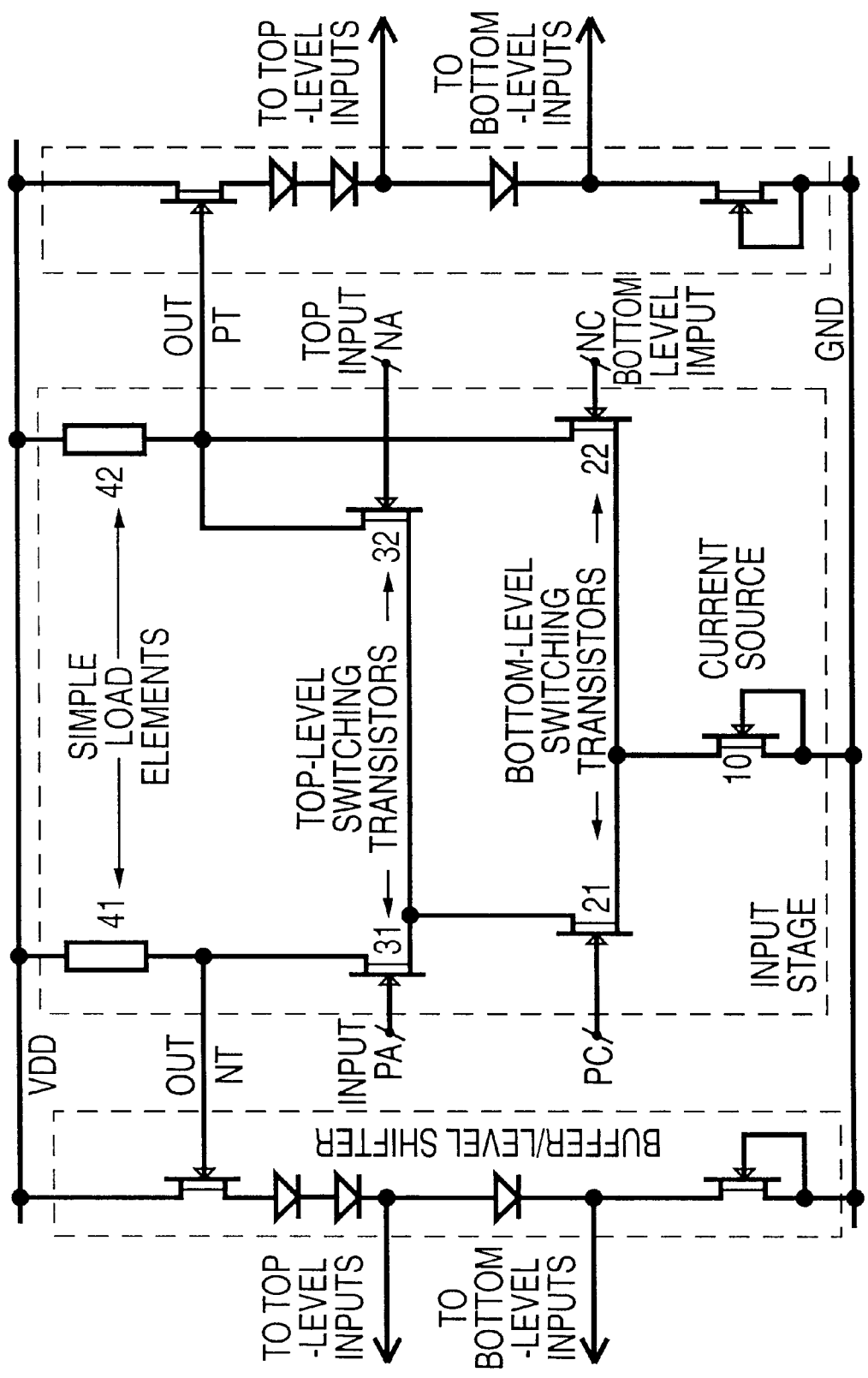
FIG. 1 is a circuit diagram of a known source couple logic gate.
Figure 2:
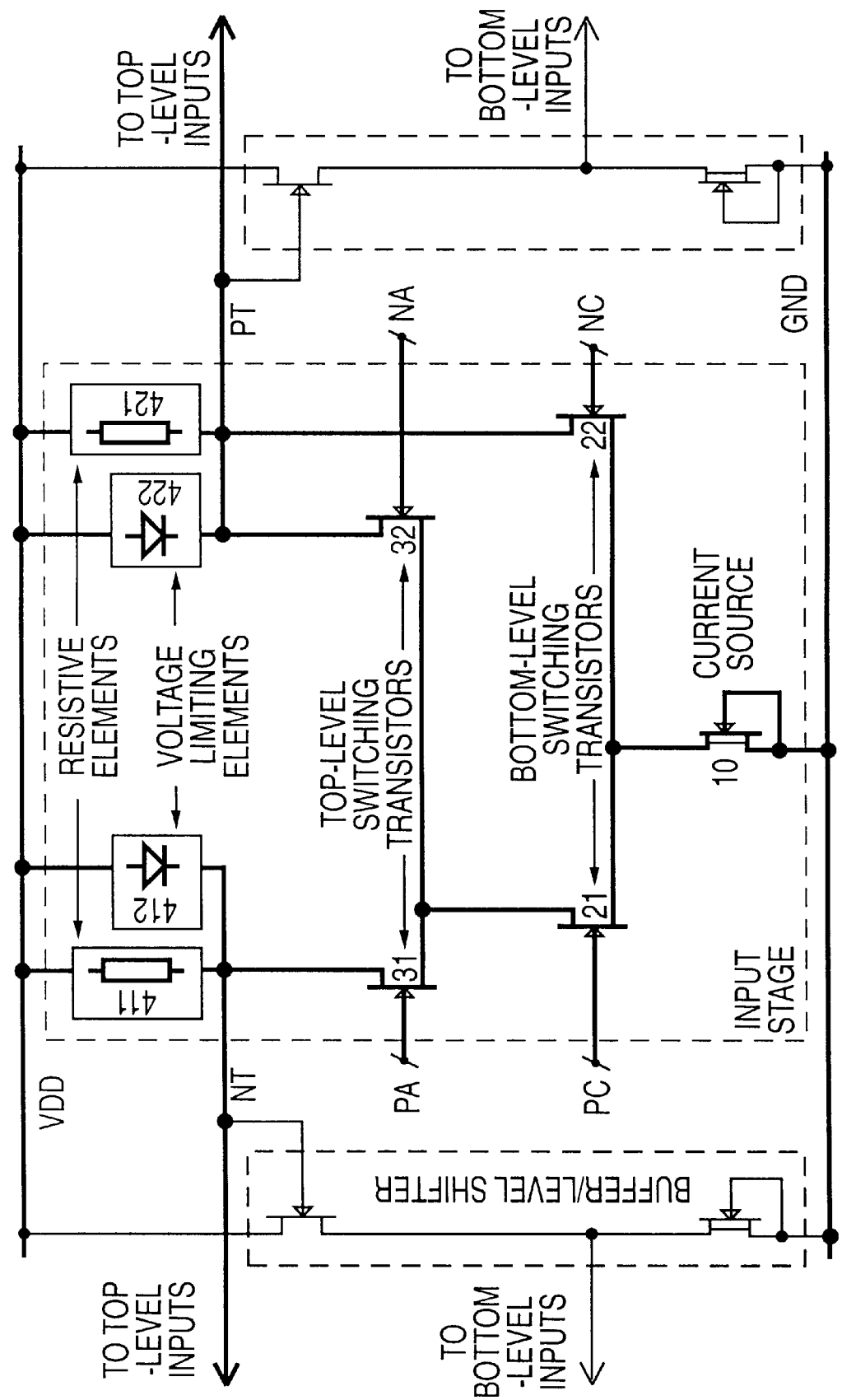
FIG. 2 shows one circuit arrangement embodying the present invention.

A circuit diagram of a source coupled logic gate embodying the present invention is shown in FIG. 2. The circuit is comparable to that shown in FIG. 1. The loading elements of the circuit comprise resistive (411, 421) and voltage limiting (412, 422) elements. The voltage limiting elements are introduced to achieve top-level input/output logic level compatibility without the requirement for a buffer/level shifter.

The voltage limiting elements, in this case Schottky diodes, maintain a high enough low output voltage level at either of the nodes PT or NT. This in turn keeps the source node voltage of the top-level switching transistors 31 and 32 at the required level to ensure that one of the transistors is kept turned ON with no substantial gate current while the other is turned OFF. As a result static HIGH output voltage equal to VDD is achieved at nodes PT or NT. The output voltage swing is given by:

$$V_{out}^1 - V_{out}^0 \leq V_D - V_t$$

where $V_D$ is a voltage drop across a Schottky diode, $V_t$ is the threshold voltage of the switching transistors, $V_{out}^1$ and $V_{out}^0$ are the HIGH and LOW voltage levels for either of the nodes PT or NT. This voltage swing applied to the top-level inputs forces the gate to operate in exactly the same manner as described above, hence, the buffer/level shifter can be omitted from the circuit for driving the top-level inputs of another gate. As a result the overall structure of more complex logic functions and circuits is simplified, leading to a reduction in power dissipation and area. Due to the omission of the buffer/level shifter the name source coupled logic is not applicable to this invention, instead, the gates are called the Direct Differential Logic (DCDL).

Figure 3:
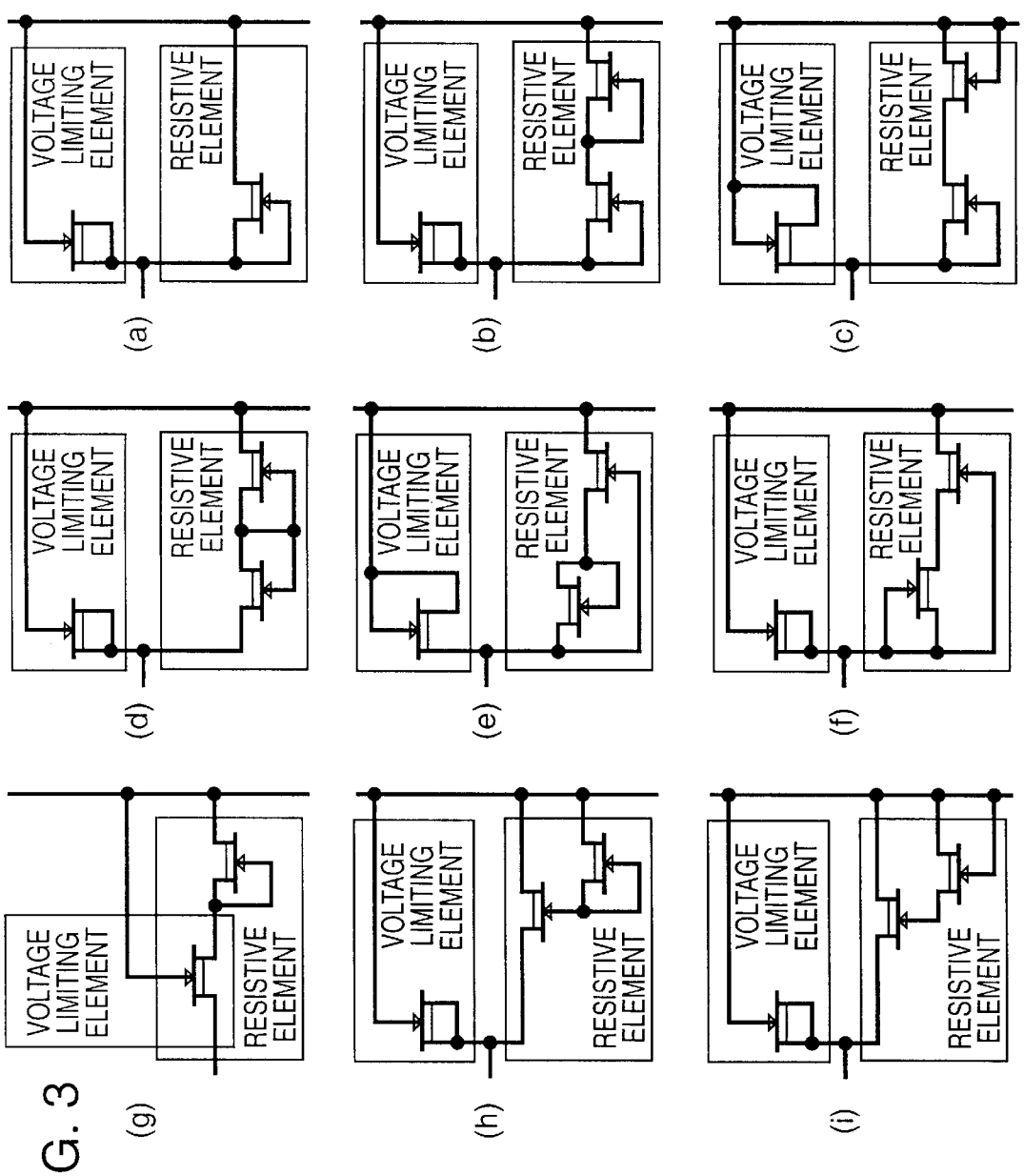
FIGS. 3(a) to (i) are various transistor implementations of the proposed loading element.

With reference to FIG. 3, the proposed loading element can be implemented using the circuit arrangements of (a), (b), (c), (d), (e), (f), (g), (h) and (i). The loading elements (411, 412) and (421, 422) shown in FIGS. 2, 4, 5, 6, 7, 8 and 9 can be replaced by any of the configurations given in FIG. 3. Transistors marked with (*) can be either depletion or enhancement mode, depending on the specification. The resistive element comprises either one transistor with gate and source shorted (a) or a combination of two transistors to achieve higher resistance. The two transistor version of the resistive element can be configured in a number of ways to achieve the desire resistance, as follows:

(1) resistive element constructed from two transistors with their gate-source shorted (b);

(2) resistive element constructed from two transistors in which both gate-source and gate-drain shorts are utilized (c), (d);

(3) resistive element constructed from two transistors in which one transistor is placed between the gate and source nodes of the other with the former either having its gate-drain (a) or gate-source shorted (f);

(4) resistive element constructed from two transistors in which the gate-sourced Schottky diode of one transistor is also used to limit the LOW voltage level (g), thus reducing the total number of transistors;

(5) resistive element constructed from two transistors in which one transistor is placed between the gate and drain nodes of the other with the former either having its gate-sourced (h) or gate-drain shorted (i). In both cases the known boot-strap effect is utilized, resulting in a higher operational frequency. The latter is the only loading element implemented using E-type transistors exclusively.

Figure 4:
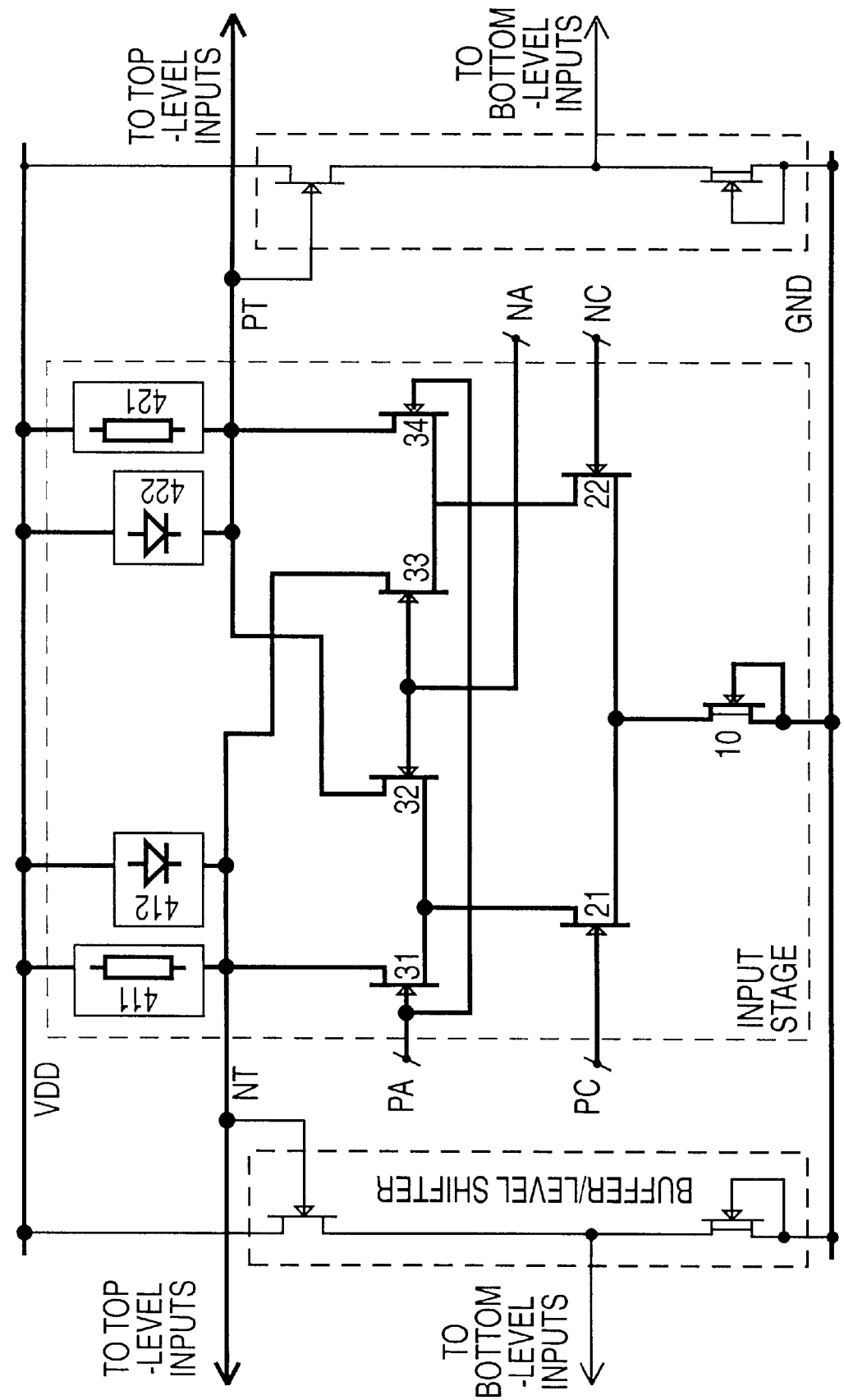
FIG. 4 is a circuit diagram of DCDL Exclusive NOR gate embodying the present invention.
Figure 5:
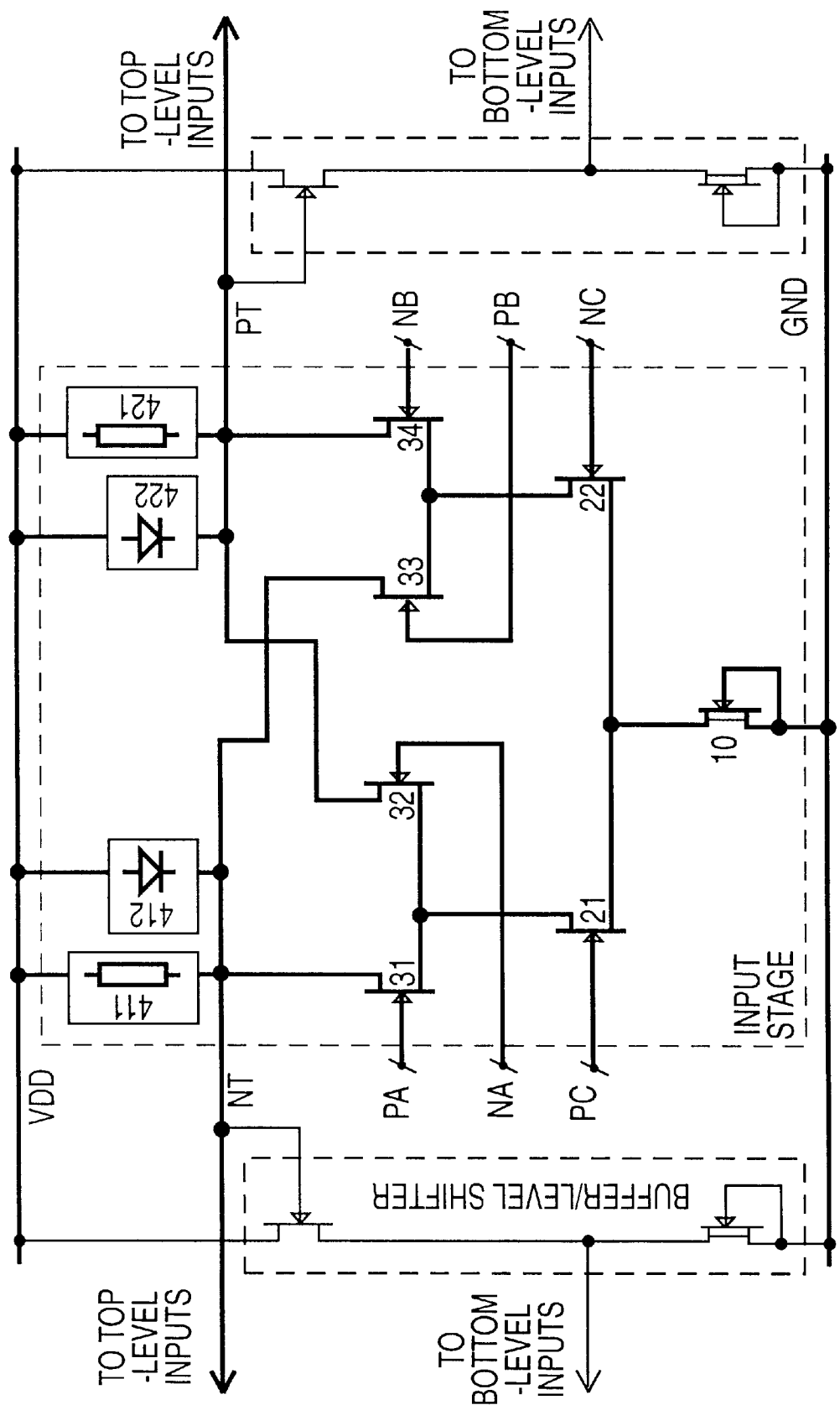
FIG. 5 is a circuit diagram of DCDL 02:1 Multiplexer embodying the present invention.

Using the above-described circuit arrangement for the loading elements, a number of DCDL gates/functions for circuits constructed from transistors with the presence of a Schottky diode at the gate region are possible. These are described as follows:

FIGS. 2, 4 and 5 are the DCDL NAND/NOR, Exclusive NOR and 2:1 multiplexer, respectively, utilizing the proposed load elements to limit the output LOW voltage levels at the nodes PT and NT. As a result no buffer/level shifters are required to drive the following gate top-level inputs, reducing the total power dissipation and gate complexity. At the same time FAN-OUT can be made high due to the negligible gate input current.

Figure 6:
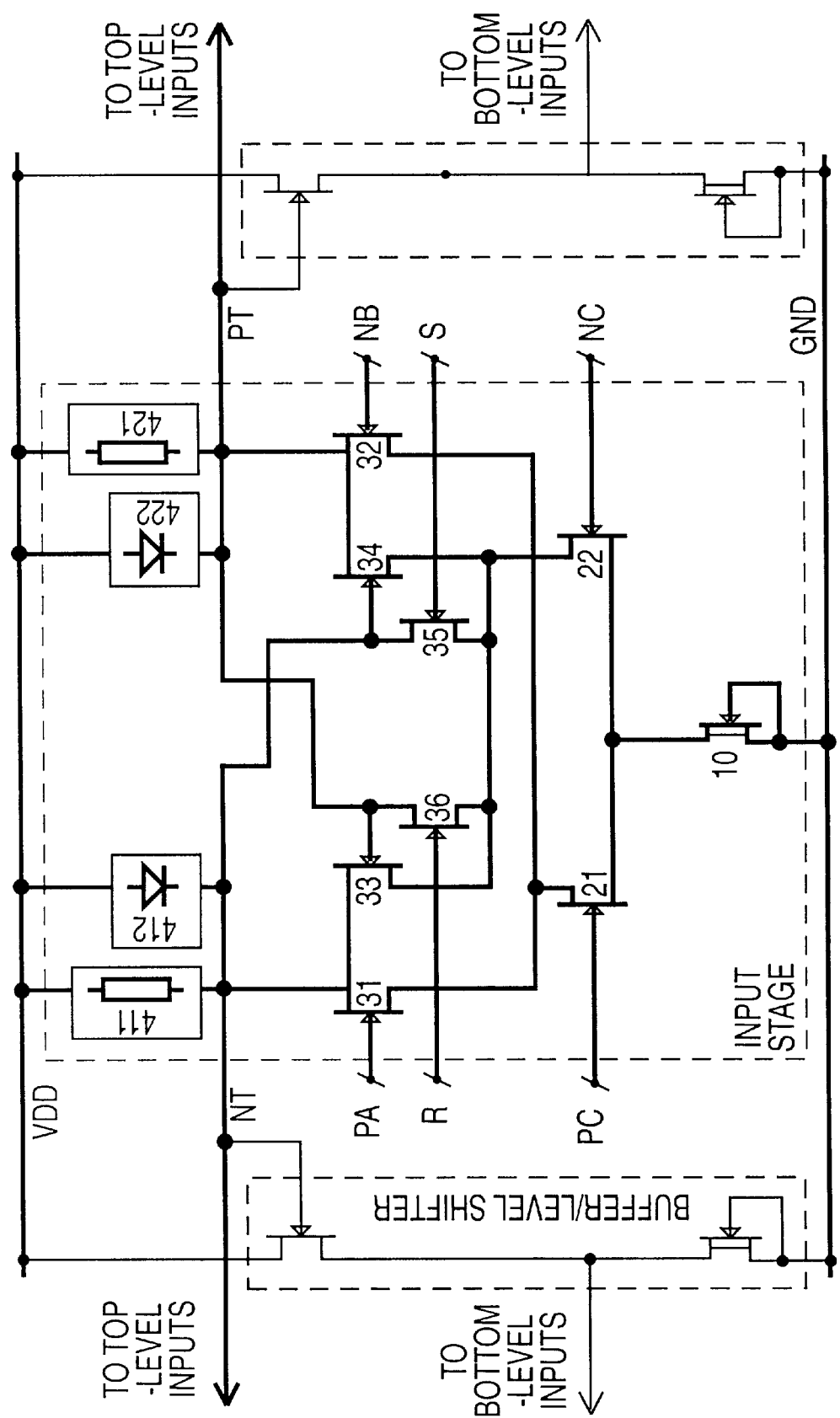
FIG. 6 is a circuit diagram of DCDL RS-type flip-flop embodying the present invention.
Figure 7:
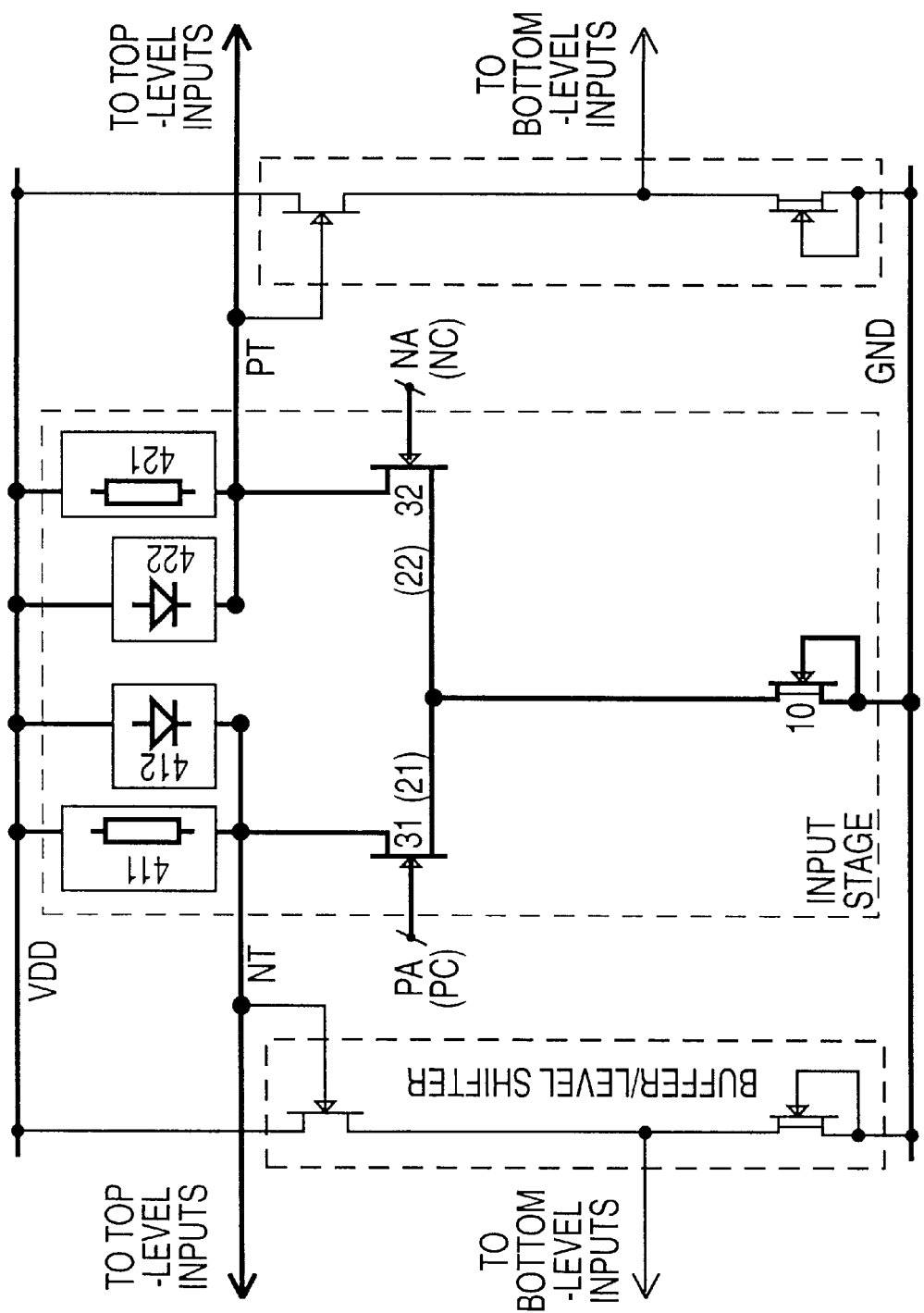
FIG. 7 is a circuit diagram of DCDL Inverter embodying the present invention.

The flip-flop configuration shown in FIG. 6 illustrates the advantage of the present invention. Since the input stage outputs PT and NT are directly connected to the gate nodes of top-level transistors 33 and 34, the flip-flop comprises only two additional SET and RESET transistors (35, 36) in comparison to the Exclusive NOR gate, given in FIG. 4. The extra transistors required for the implementation of the flip-flop consume no additional power, resulting the circuit to dissipate the same power as the simple inverter of FIG. 7.

Figure 8:
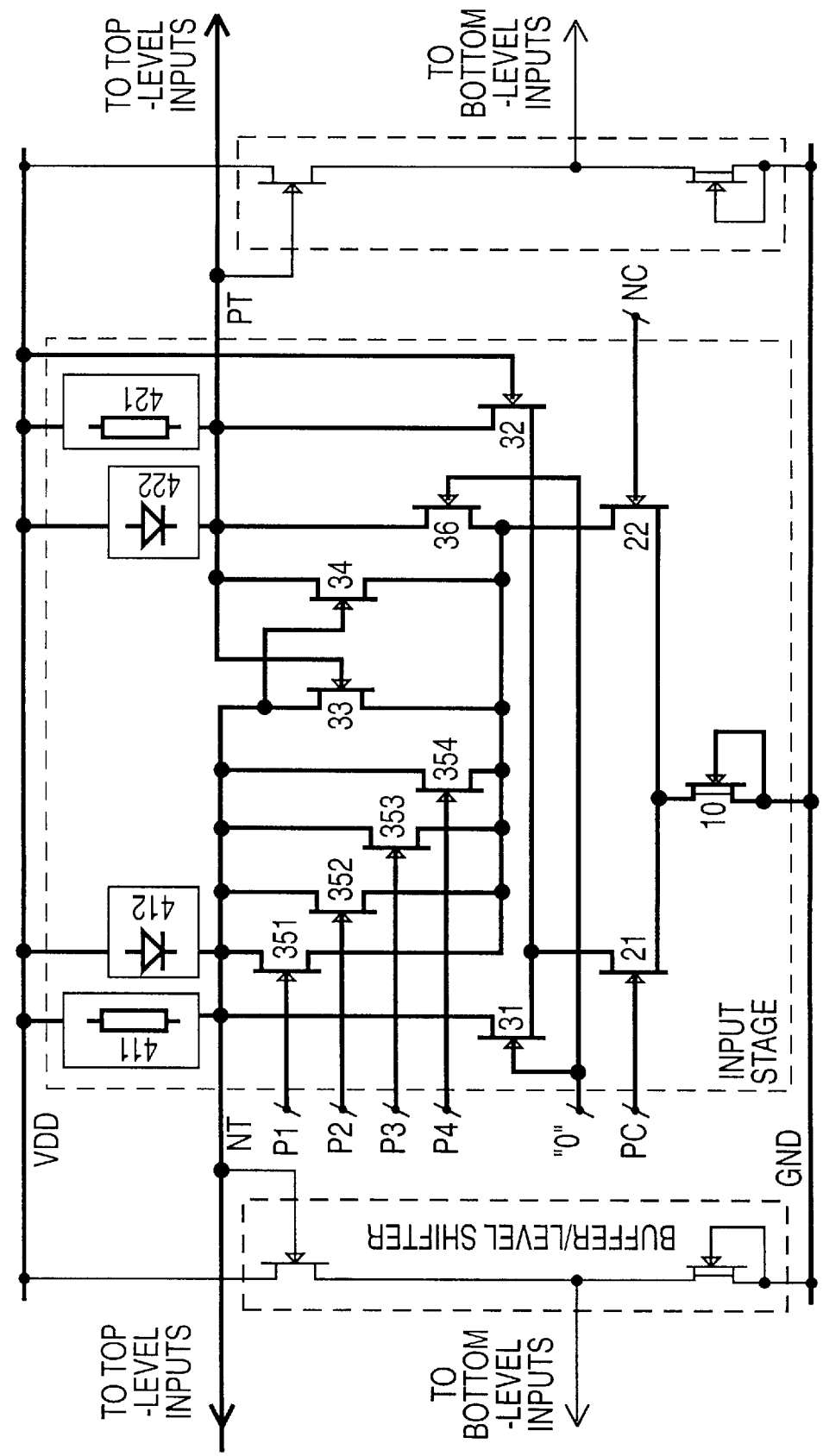
FIG. 8 is a circuit diagram of DCDL multi-input NOR gate embodying the present invention.

FIG. 8 shows a 4-input NOR gate which is a flip-flop with increased number of SET transistors. The gate is pre-set by applying LOW logic level to the gate of the transistor 31 and HIGH logic level (VDD) to the gate of the transistor 32 while the bottom-level input signals PC and NC are set HIGH and LOW, respectively. When the signals PC and NC are switched, the cross-coupled transistors 33 and 34 keep the outputs PT and NT at HIGH and LOW logic levels, respectively, provided all the inputs P1 through P4 are LOW. The output will switch upon the application of a HIGH input logic level on any of the inputs P1 through P4. Transistor 36 as an equivalent loading to transistors 351 through 354 is introduced to maintain a balanced output. The number of the gate inputs can typically vary from 4 to 10, depending on the transistor parameters.

Figure 9:
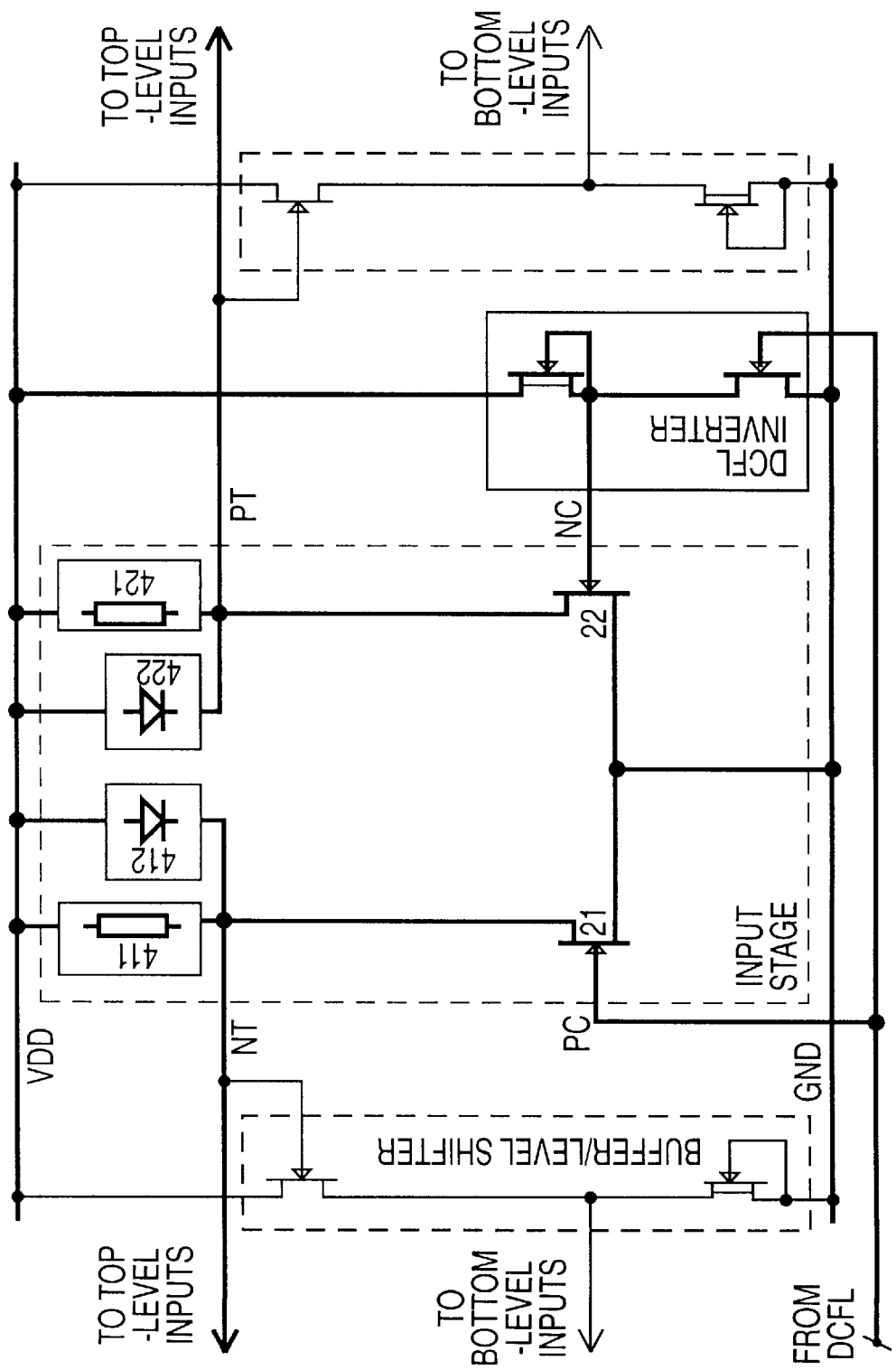
FIG. 9 is a circuit diagram of DCDL-to-DCFL converter embodying the present invention.
Figure 10:
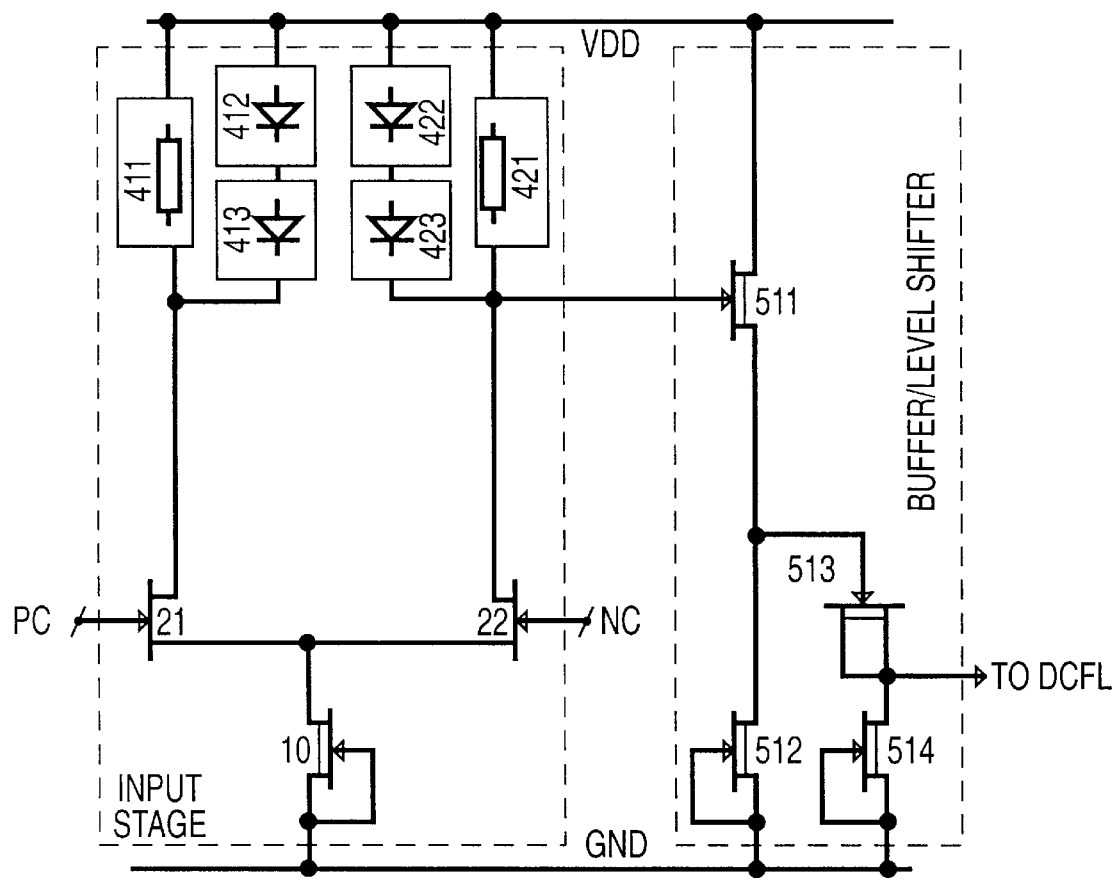
FIG. 10 is a circuit diagram of a DCFL-to-DCDL converter embodying the present invention.

The converters shown in FIGS. 9 and 10 provide an interface between DCDL and DCFL gates, making it possible for the two logic elements to co-exist within one circuit. The DCFL-to-DCDL converter of FIG. 9 comprises an input stage utilizing DCFL inverters with the load elements described herein to ensure the compatibility of their output voltage levels with the DCDL top-level input voltages. These inverters are driven by true and inverted signals, the latter being produced by a simple DCFL gate. The DCDL-to-DCFL converter of FIG. 10 consists of an input stage, utilizing a DCDL inverter with twice the output voltage swing due to the extra voltage limiting elements 413 and 423. The output voltage level shifter consists of the transistors 511 through 514 to ensure compatible voltage levels to that of the DCFL gate.

It will be obvious to those having skill in the art that many changes may be made to the details of the above-described embodiment of this invention without departing from the underlying principles thereof. The scope of the present invention should, therefore, be determined only by the following claims.

We claim:

1. A direct coupled logic gate having an input stage comprising:

first and second branch circuits each connected between a common power supply voltage source VDD and ground;

the first branch circuit including a first, normally-OFF, FET switching transistor;

the second branch circuit including a second, normally-OFF, FET switching transistor;

the first and second FET switching transistors arranged in a common source configuration, and each having a respective gate terminal for receiving a corresponding one of a pair of input logic signals;

a first loading element disposed in the first branch circuit between VDD and the first FET switching transistor; and a second loading element disposed in the second branch circuit between VDD and the second FET switching transistor;

wherein each loading element includes at least one resistive element and at least one voltage limiting element connected in parallel with one another.

2. A direct coupled logic gate having an input stage according to claim 1, wherein the or each voltage limiting element is a Schottky diode.

3. A direct coupled logic gate having an input stage according to claim 2, wherein the Schottky diode comprises a transistor having its source and drain shorted.

4. A direct coupled logic gate having an input stage according to claim 1, wherein the loading element is implemented using a transistor.

5. A direct coupled logic gate having an input stage according to claim 4, wherein the resistive element of the loading element comprises the transistor having its gate and source shorted.

6. A direct coupled logic gate having an input stage according to claim 4, wherein the loading element is implemented using one or more transistors to achieve a higher resistive value.

7. A direct coupled logic gate having an input stage according to claim 4, wherein the transistor is a metal semiconductor field affect transistor.

8. A direct coupled logic gate having an input stage according to claim 4, wherein the transistor is a high electron mobility transistor.

9. A multi-input NOR logic gate having an input stage including a loading arrangement according to claim 1.

10. A DCFL-to-DCDL or DCDL-to-DCFL converter incorporating a loading arrangement according to claim 1.

11. A multi-input NOR logic gate configuration having an input stage including a loading arrangement according to claim 1.

12. A 2-to-1 Multiplexer logic gate configuration having an input stage including a loading arrangement according to claim 1.

13. A flip-flop circuit having an input stage including a loading arrangement according to claim 1.

* * * * *